(12) United States Patent
Hirano

(10) Patent No.: US 8,008,979 B2
(45) Date of Patent: Aug. 30, 2011

(54) FREQUENCY SYNTHESIZER AND RADIO TRANSMITTING APPARATUS

(75) Inventor: Shunsuke Hirano, Kanagawa (JP)

(73) Assignee: Panasonic Corporation, Osaka (JP)

(*) Notice: Subject to any disclaimer, the term of this patent is extended or adjusted under 35 U.S.C. 154(b) by 79 days.

(21) Appl. No.: 12/566,347

(22) Filed: Sep. 24, 2009

(65) Prior Publication Data

US 2010/0073095 A1 Mar. 25, 2010

(30) Foreign Application Priority Data

Sep. 25, 2008 (JP) ................... 2008-246624

(51) Int. Cl.
*H03L 7/085* (2006.01)
*H03L 7/099* (2006.01)
*H03L 7/18* (2006.01)
*H04B 1/04* (2006.01)

(52) U.S. Cl. .............. 331/16; 331/1 A; 331/25; 455/119

(58) Field of Classification Search .............. 331/1 A, 331/8, 16–18, 25; 327/156–159; 329/325; 332/127; 360/51; 375/376; 455/260, 119
See application file for complete search history.

(56) References Cited

U.S. PATENT DOCUMENTS

| 5,952,895 | A | 9/1999 | McCune |
| 6,269,135 | B1 | 7/2001 | Sander |
| 6,765,977 | B1 * | 7/2004 | Adams et al. ............. 375/376 |
| 6,826,388 | B1 | 11/2004 | Tanaka |
| 6,960,962 | B2 | 11/2005 | Peterzell |

FOREIGN PATENT DOCUMENTS

| JP | 2001-251186 | 9/2001 |
| JP | 2008-109680 | 5/2008 |

* cited by examiner

*Primary Examiner* — David Mis
(74) *Attorney, Agent, or Firm* — Dickinson Wright PLLC

(57) ABSTRACT

A frequency synthesizer (100) can selectively set an output band of VCO, and consumes less power. The frequency synthesizer (100) has a frequency converting circuit (110) that has a mixer (111) and a frequency divider (112) connected with each other in parallel. The frequency synthesizer (100) uses the frequency divider (112) upon frequency band selection in VCO (101) and uses the mixer (111) upon transmission.

5 Claims, 14 Drawing Sheets

FREQUENCY SYNTHESIZER AND RADIO TRANSMITTING APPARATUS

CROSS REFERENCE TO RELATED APPLICATIONS

The disclosure of Japanese Patent Application No. 2008-246624, filed on Sep. 25, 2008, including the specification, drawings and abstract, is incorporated herein by reference in its entirety.

TECHNICAL FIELD

The present invention relates to a frequency synthesizer that is used to generate transmission signals of a carrier frequency band (i.e. radio band), and a radio transmitting apparatus that uses the frequency synthesizer.

BACKGROUND ART

Conventionally, a frequency synthesizer is provided in radio equipment to up-convert modulated signals to generate transmission signals (i.e. radio signals) of a carrier frequency band.

An example of such a frequency synthesizer is disclosed in Patent Literature 1. Meanwhile, a frequency synthesizer is referred to as "transmitting apparatus" in Patent Literature 1 and therefore the apparatus disclosed in Patent Literature 1 will be referred to as "transmitting apparatus" below. FIG. 1 shows a schematic configuration of the transmitting apparatus disclosed in Patent Literature 1. As shown in FIG. 1, voltage control oscillator 1 (hereinafter "VCO 1") that changes the output frequency according to input voltage, mixer 2 that down-converts the output F_out of VCO 1, phase comparator 3 that compares the phases of the output of the mixer and reference signal F_IF and outputs the phase difference (i.e. phase error), loop filter 4 that smoothes the output signal of phase comparator 3, and local signal generating circuit 5 that generates a local signal of mixer 2, are provided. A PLL (Phase-Locked Loop) circuit having a function of shifting a frequency in this way using a mixer is referred to as "offset PLL."

Here, F_IF is, for example, a modulated signal of the IF (Intermediate Frequency) band generated in a quadrature modulator. F_IF is up-converted to the RF (Radio Frequency) band by PLL that controls VCO 1, and the up-converted transmission signal F_out of the RF band is outputted from VCO 1. The noise components of the modulated signal F_IF of the IF band are suppressed by frequency characteristics of PLL that controls VCO 1 and, consequently, the configuration shown in FIG. 1 is generally used popularly in GSM mobile telephones and so on.

Patent Literature 2 discloses a VCO frequency band switching-type frequency synthesizer that uses a PLL circuit. FIG. 2 shows the configuration of the frequency synthesizer disclosed in Patent Literature 2. As shown in FIG. 2, PLL section 11, frequency band selecting circuit 12 that outputs a selection signal S for selecting and shifting the oscillation frequency band of VCO 13 in response to a shift signal SS, sampling circuit 14 that generates a sampling value CO acquired by supplying a ground voltage GND to VCO 13 at the oscillation frequency band that is selected first and by sampling and counting a VCO output signal VO for a certain period, comparing circuit 15 that compares the sampling value CO and an expected value EX and outputs a voltage control switch signal SV and the shift signal SS according to the comparison result and expected value register 16 that holds the expected value EX, are provided.

FIG. 3 shows control voltage SC-versus-oscillation frequency characteristics in VCO 13 in FIG. 2. In case where VCO 13 is incorporated in an LSI, the distribution of element values makes the distribution of oscillation frequencies significant. Therefore, as shown in FIG. 3, VCO 13 is configured to cover a wide range of the oscillation frequency such that the oscillation frequency can be switched between a plurality of frequency bands A to G. Then, when the frequency of the output signal VO is switched, the output frequency from VCO 13 is measured in the counter circuit and an optimal frequency band is selected by frequency band selecting circuit 12 from a plurality of frequency bands shown in FIG. 3.

Citation List
Patent Literature
PTL 1: Japanese Patent Application Laid-Open No. 2008-109680
PTL 2: Japanese Patent Application Laid-Open. No. 2001-251186
PTL 3: U.S. Pat. No. 6,269,135

SUMMARY OF INVENTION

Technical Problem

Here, VCO 1 used in the transmitting apparatus in FIG. 1 may be configured in the same way as VCO 13 in FIG. 2 to cover a plurality of frequency bands in FIG. 3 to suppress the distribution of the oscillation frequency (i.e. transmission signal frequency) due to the distribution of the elements produced when VCO 1 is integrated in an LSI.

However, in case where a plurality of oscillation frequency bands are covered by VCO 1 and an optimal oscillation frequency is selected from these plurality of oscillation bands in the configuration in FIG. 1, there is a problem that power consumption in circuits increases.

This problem will be explained using a specific example below. A case will be assumed here where a command signal for commanding the transmitting apparatus in FIG. 1 to change the frequency (i.e. target frequency) of the transmission signal F_out to 1.91 [GHz], is received from the base station. At this time, the local frequency F_local is set to 1.99 [GHz], and, after the operation of PLL stabilizes, the output frequency from mixer 2 becomes 80 [MHz] (=1.99 [GHz]−1.91 [GHz]). However, in case where VCO 1 covers the range of the oscillation frequency between 1.5 [GHz] and 2.1 [GHz] by means of a plurality of bands, when the frequency band of VCO 1 is selected and set, the output of mixer 2 changes in a wide range between −110 [MHz] and 490 [MHz]. Accordingly, the maximum operation frequency of phase comparator 3 that receives this output signal rises to 490 [MHz], resulting in the increase in power consumption.

Solution to Problem

It is therefore an object of the present invention to reduce power consumption in a frequency synthesizer that can selectively set an output band of VCO.

To achieve the above object, the present invention employs a configuration which includes: a voltage control oscillator that covers a plurality of selectable oscillation frequency bands and that oscillates a signal of a frequency matching a voltage applied to a control voltage terminal; a frequency converting circuit that has a mixer and a frequency divider connected with each other in parallel and that down-converts a frequency of an output signal of the voltage control oscillator using selectively one of the mixer and the frequency divider; a comparator that compares a signal outputted from the frequency converting circuit, with a reference signal, and outputs a comparison result signal; and a loop filter that smoothes the comparison result signal and outputs the smoothed signal to the control voltage terminal of the voltage control oscillator.

DESCRIPTION OF EMBODIMENTS

Embodiments of the present invention will be explained in detail below with reference to the accompanying drawings.

Embodiment 1

Figure 1:
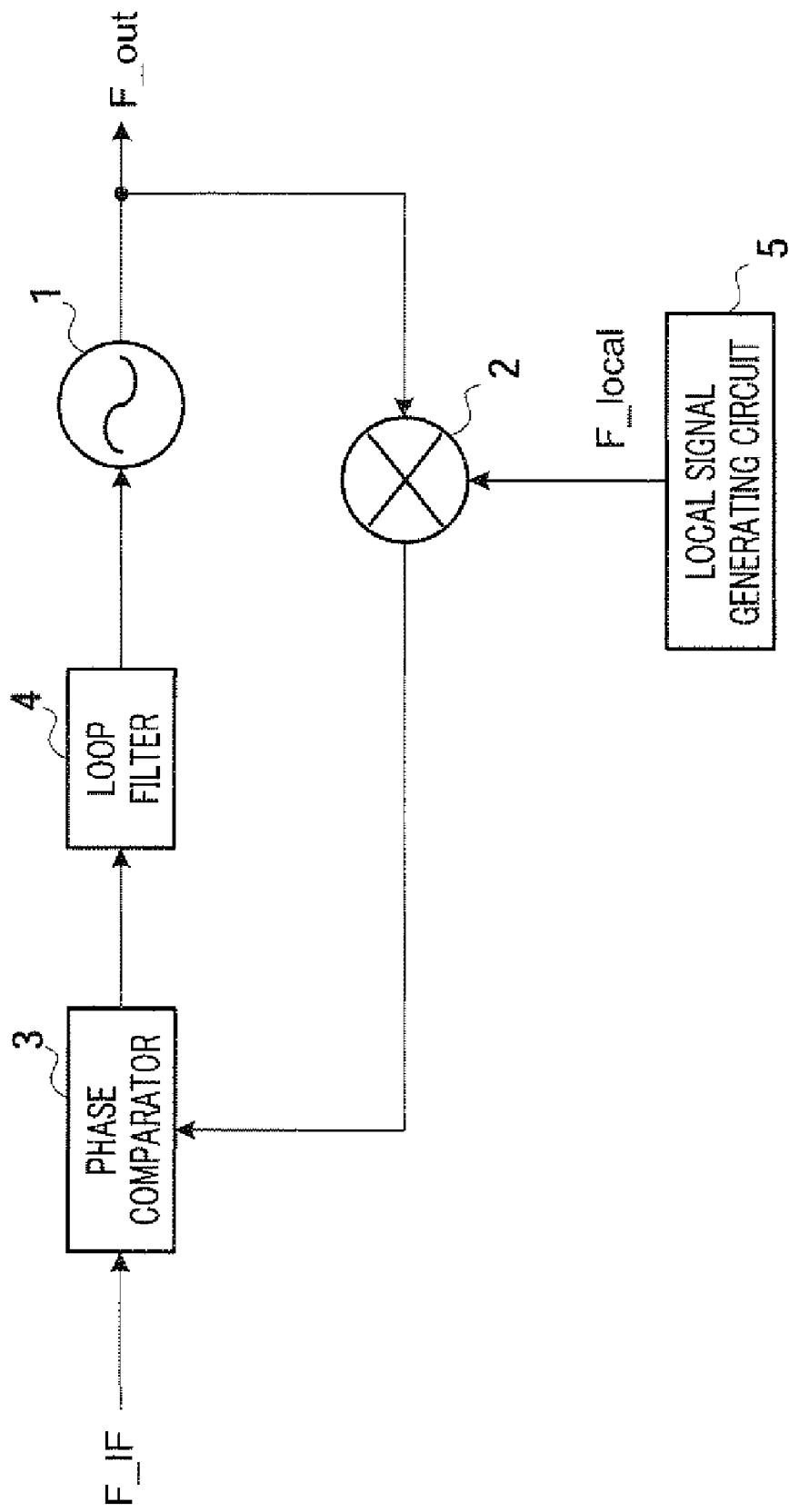
FIG. 1 is a block diagram showing a schematic configuration of a transmitting apparatus disclosed in Patent Literature 1.
Figure 2:
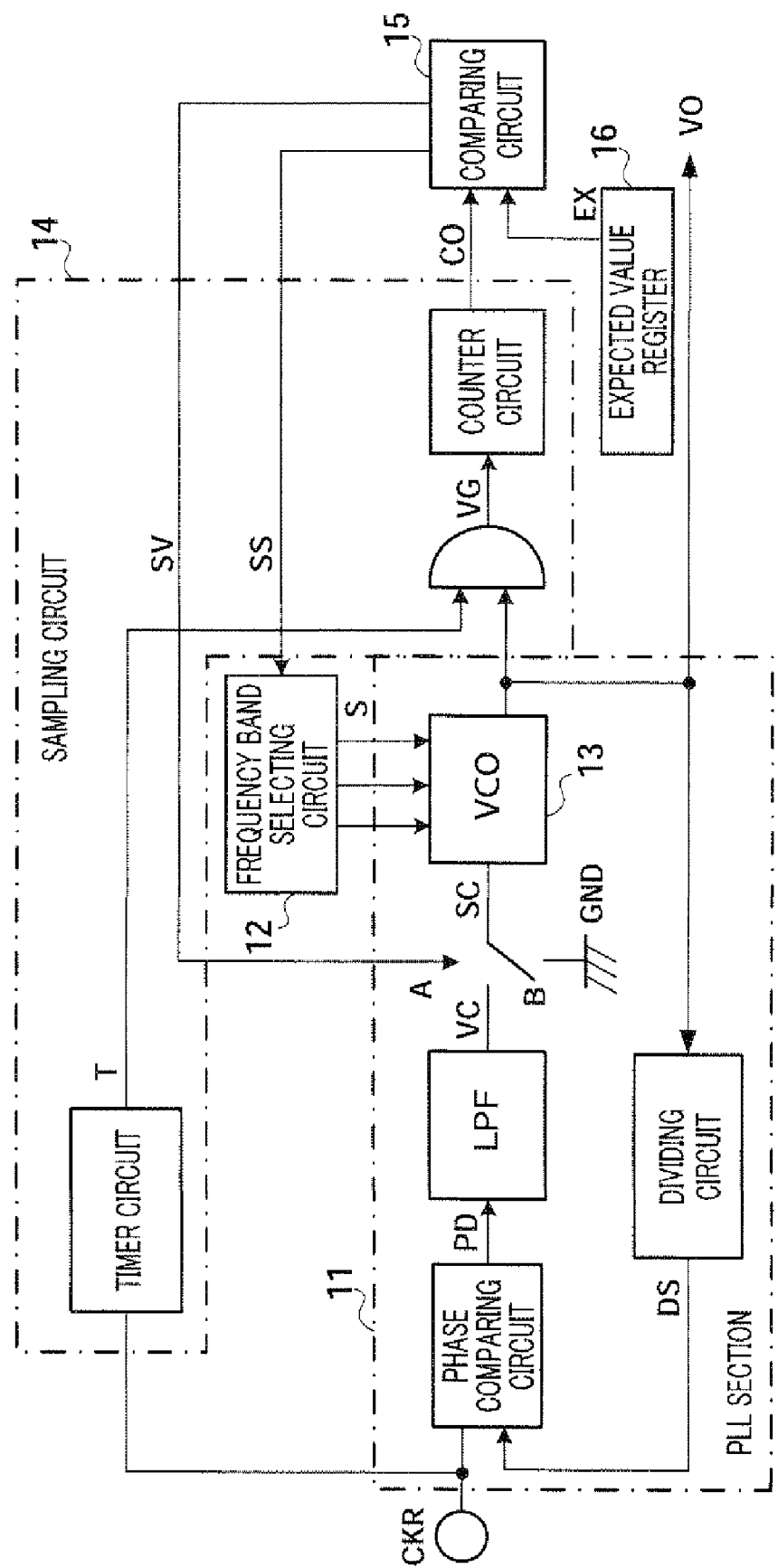
FIG. 2 is a block diagram showing a configuration of a frequency synthesizer disclosed in Patent Literature 2.
Figure 3:
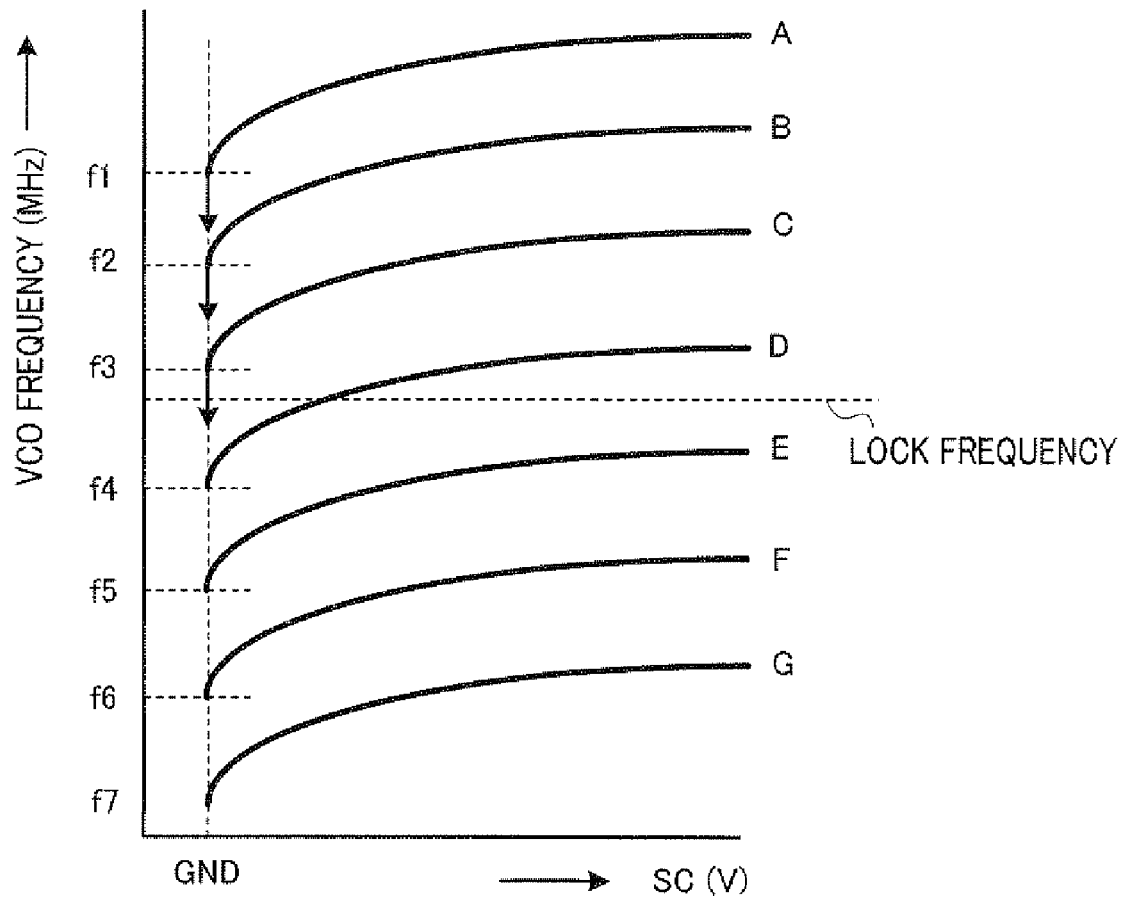
FIG. 3 shows control voltage-versus-oscillation frequency characteristics in VCO.
Figure 4:
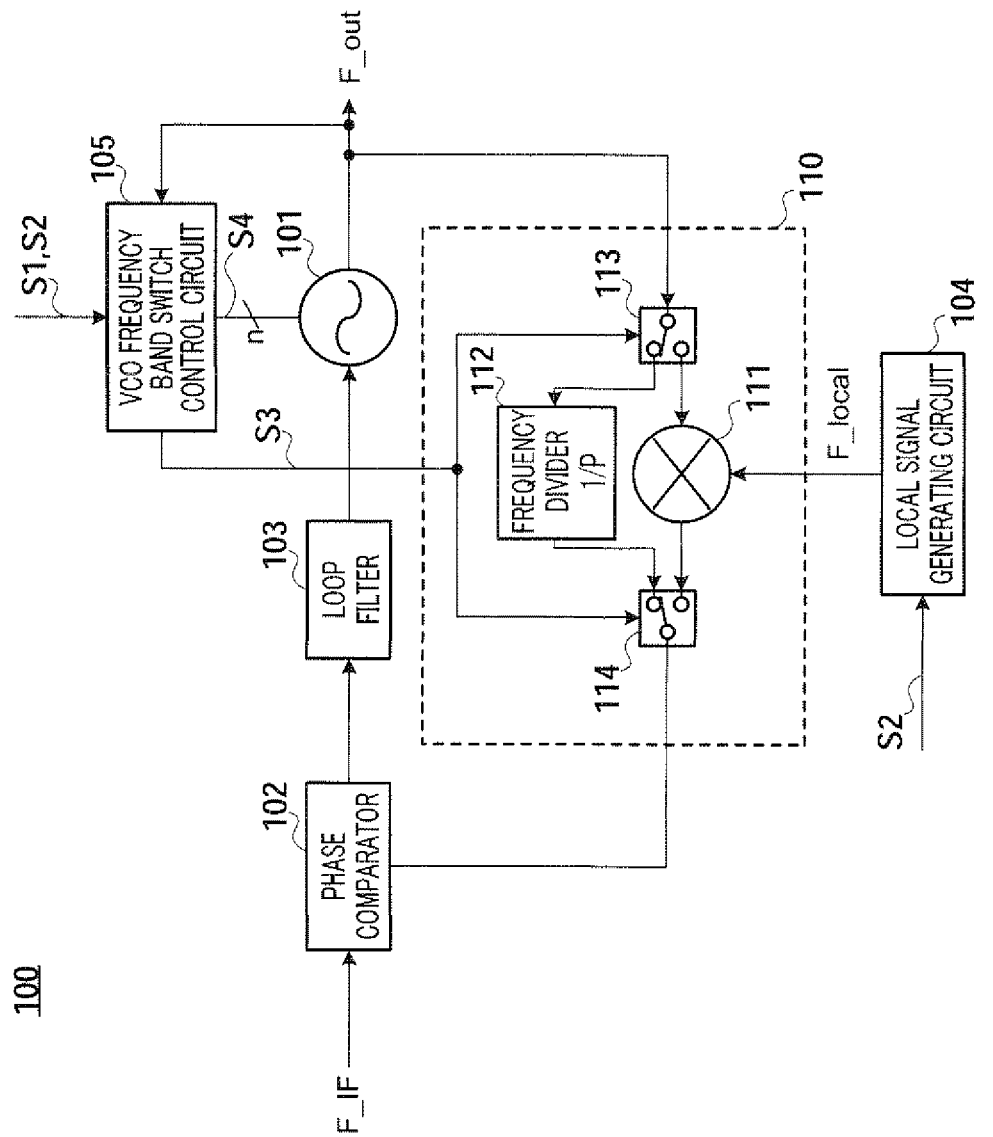
FIG. 4 is a block diagram showing a configuration of a frequency synthesizer according to Embodiment 1 of the present invention.

FIG. 4 shows the configuration of a frequency synthesizer according to Embodiment 1 of the present invention. Frequency synthesizer 100 of the present embodiment employs an offset PLL configuration having a function of shifting a frequency using a mixer. Frequency synthesizer 100 is provided in, for example, the transmitting section of a terminal. Although a case will be explained below where frequency synthesizer 100 is provided in the transmitting section of a terminal, the frequency synthesizer of the present invention is not limited to terminals and is widely applicable to various radio equipment.

Frequency synthesizer 100 includes VCO 101 that oscillates a signal of a frequency matching the voltage applied to a control voltage terminal; frequency converting circuit 110 that down-converts the frequency of the output signal F_out of VCO 101; phase comparator 102 that compares the signal outputted from frequency converting circuit 110 and the reference signal F_IF and outputs a comparison result signal; loop filter 103 that smoothes the comparison result signal and outputs the smoothed signal to the control voltage terminal of VCO 101; local signal generating circuit 104 that generates a local signal F_local used in frequency converting circuit 110; and VCO frequency band switch control circuit 105. In frequency synthesizer 100, VCO 101, frequency converting circuit 110, phase comparator 102 and loop filter 103 form PLL.

Phase comparator 102 receives as input the F_IF signal as the reference signal. This F_IF signal is, for example, a modulated signal of the IF (Intermediate Frequency) band generated in a quadrature modulator. The F_IF signal is up-converted to the RF (Radio Frequency) band by PLL that controls VCO 101, and the up-converted transmission signal F_out of the RF band is outputted from VCO 101. The noise components of the modulated signal F_IF of the IF band are suppressed by frequency characteristics of PLL that controls VCO 101.

VCO 101 is configured to select one of n frequency bands (hereinafter "bands") according to a band selection signal S4 received as input in a frequency band selecting terminal. Such a configuration of VCO that can select one band from a plurality of bands is disclosed in, for example, Patent Literature 2 and is known, and therefore explanation thereof will be omitted.

Frequency converting circuit 110 has mixer 111 and frequency divider 112 connected with each other in parallel, and down-converts the output signal of VCO 101 using selectively one of mixer 111 and frequency divider 112. To be more specific, depending on which side switch 113 and switch 114 are connected with, which one of mixer 111 and frequency divider 112 is used is selected. That is, switch 113 and switch 114 are connected with the mixer 111 side when mixer 111 is used, and are connected with the frequency divider 112 side when frequency divider 112 is used. Switching control for switches 113 and 114 is performed according to a switching control signal S3 from VCO frequency band switch control circuit 105.

Local signal generating circuit 104 is formed using a PLL circuit that has, for example, VCO, a frequency divider, phase comparator and loop filter, and can generate a local signal of a desired frequency. Local signal generating circuit 104 outputs the generated local signal F_local to mixer 111.

When receiving as input a frequency switch start signal S1 transmitted from the base station, VCO frequency switch control circuit 105 controls frequency synthesizer 100 in frequency band selecting mode. To be more specific, when receiving the frequency switch start signal S1 as input, VCO frequency band switch control circuit 105 connects a frequency divider between VCO 101 and phase comparator 102 by means of the switching control signal S3 (see the state in FIG. 4). By contrast with this, when deciding that the frequency band selection is finished (that is, when deciding that the frequency band of the output signal F_out of VCO 101 settles in the target band), VCO frequency band switch control circuit 105 connects mixer 111, instead of frequency divider 112, between VCO 101 and phase comparator 102, by means of the switching control signal S3.

Further, VCO frequency band switch control circuit 105 receives as input target frequency information S2 transmitted from the base station, compares this target frequency information S2 and the frequency of the output signal F_out of VCO 101, and outputs the band selection signal S4 matching the comparison result, to the band selecting terminal of VCO 101. By this means, the band of the output signal F_out of VCO 101 is set to cover the target frequency. Meanwhile, the operation of performing more fine adjustment of the frequency of the output signal F_out to the target frequency in the set band, is performed by the lock operation of PLL using mixer 111.

Further, according to the communication situation with each terminal, the base station transmits control signals (i.e. frequency switch start signal S1 and target frequency information S2) for commanding each terminal to change the transmission frequency band. These control signals that command to change the transmission frequency band are transmitted, for example, when a cell to which a terminal belongs changes or when the received electric field intensity of the frequency band that is currently used, becomes little. In case of, for example, the GSM scheme, the frequency band is usually changed at intervals of several hundred microseconds.

Next, the operation of frequency synthesizer 100 of the present embodiment will be explained using the timing chart in FIG. 5.

When VCO frequency band switch control circuit 105 receives as input the frequency switch start signal S1 from the base station at time point t1, frequency synthesizer 100 starts the frequency band selection operation of VCO. After frequency synthesizer 100 starts the frequency band selection operation of VCO at time point t1, VCO frequency band switch control circuit 105 places the switching control signal S3 in a high state such that frequency divider 112 is used in frequency converting circuit 110.

In a state where frequency divider 112 is selected in this way, frequency synthesizer 100 finishes the frequency band selection operation after VCO frequency band switch control circuit 105 performs a control to sequentially switch the band of VCO 101 by means of the band selection signal S4 and selects a band that covers the target frequency.

Further, although, with the present embodiment, a frequency switch start timing is detected using the frequency switch start signal S1, the frequency switch start timing may be detected based on the timing target frequency information S2 switches. Consequently, it is possible to carry out the same processing as the present embodiment without using the frequency switch start signal S1.

Figure 5:
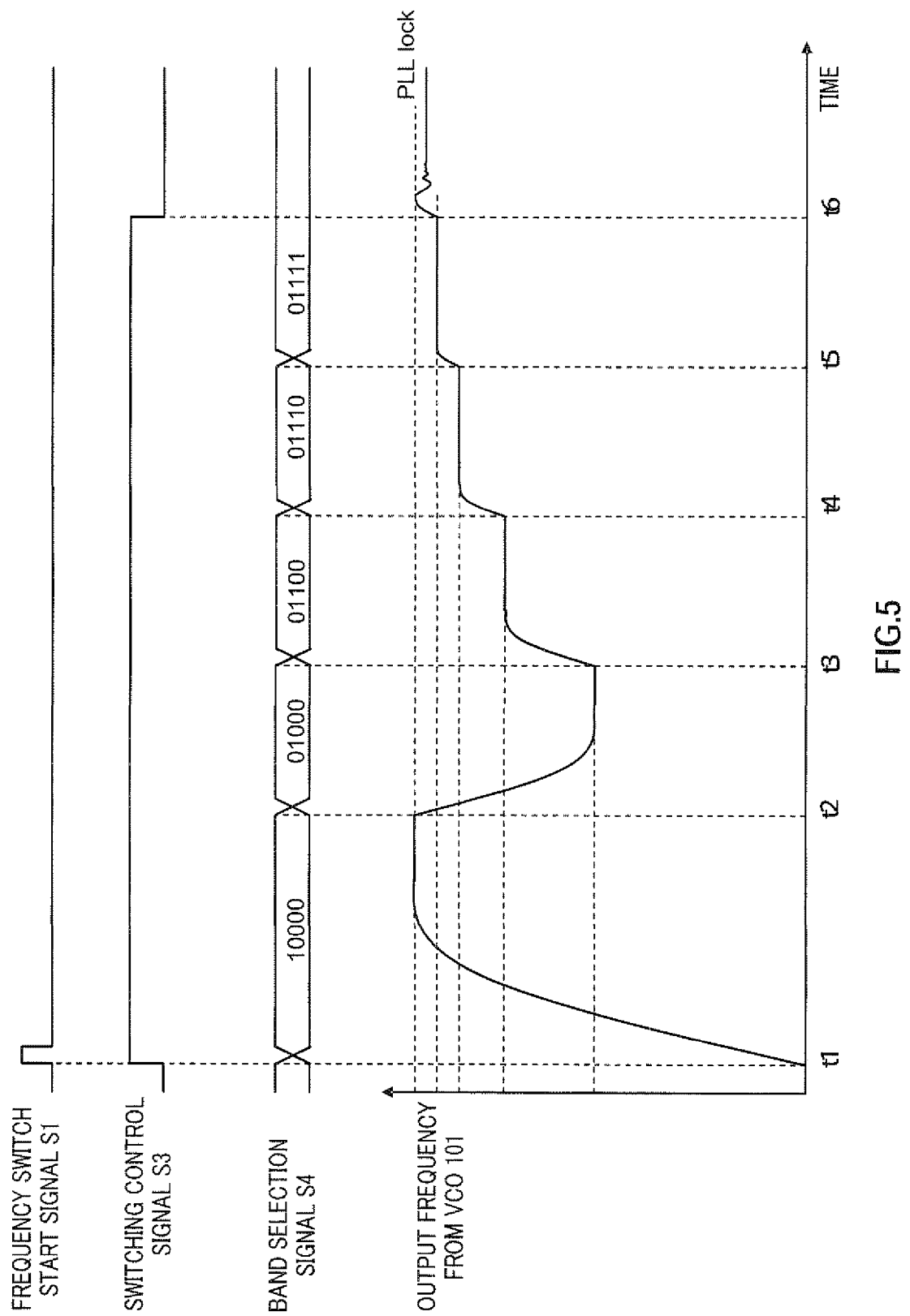
FIG. 5 illustrates the operation of Embodiment 1.

FIG. 5 shows an example of band selection where the frequency band of VCO 101 is made closer to the target frequency using the binary search algorithm. A band is selected at each time point t1 to t5 using the binary search algorithm and the band that covers the target frequency is selected at time point t5.

In frequency synthesizer 100, when VCO frequency band switch control circuit 105 determines the frequency band that covers the target frequency, VCO frequency band switch control circuit 105 places the switching control signal S3 in a low state such that mixer 111 is used in frequency converting circuit 110.

In a state where mixer 111 is selected in this way (after time point t6), frequency synthesizer 100 enters the normal operation of synchronizing the frequency of PLL with the target frequency and stabilizes at the target frequency finally.

Figure 6:
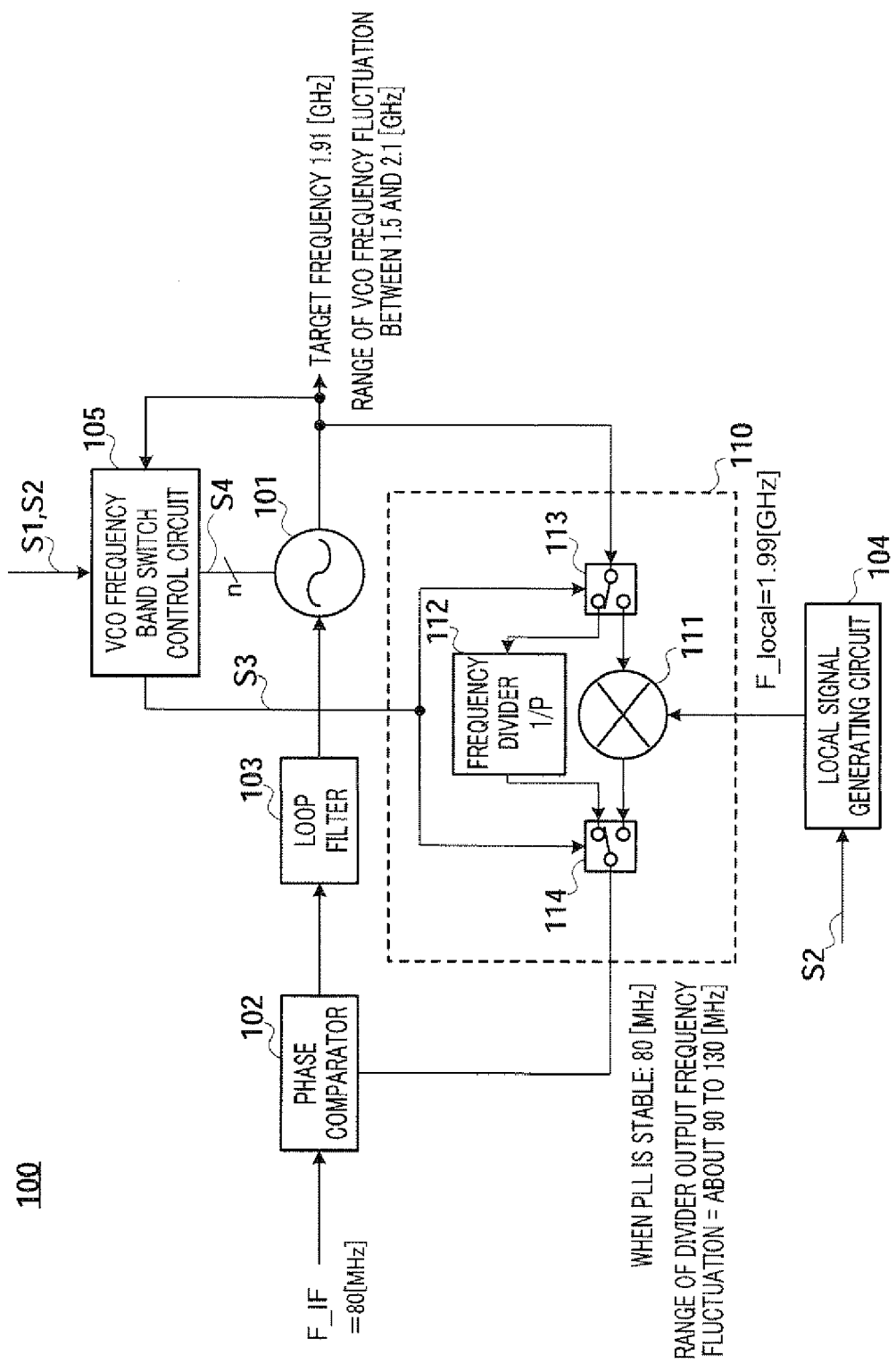
FIG. 6 shows an example of frequency characteristics in the frequency synthesizer according to Embodiment 1.

FIG. 6 shows an example of the frequency in frequency synthesizer 100 according to the present embodiment. Further, FIG. 7, assigning the same reference numerals to the same components as in FIG. 6, shows an example of the frequency in case where frequency divider 112 is not provided, compared with the present embodiment.

Figure 7:
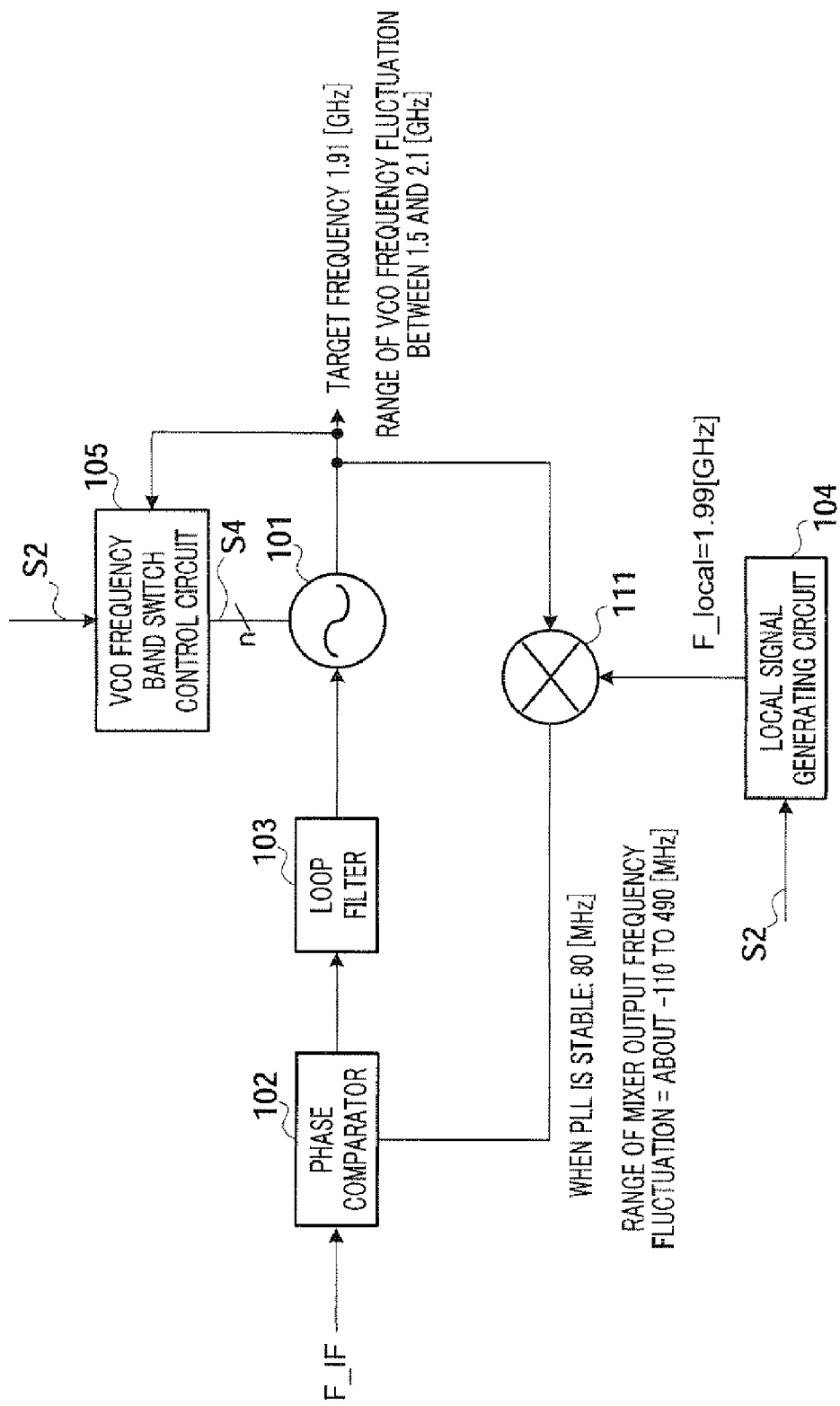
FIG. 7 shows an example of frequency characteristics compared with Embodiment 1.

First, the frequency in FIG. 7 which is compared with the present embodiment will be explained. FIG. 7 shows a case as an example where the target frequency is 1.91 [GHz], the local frequency is 1.99 [GHz] and the range of the oscillation frequency of VCO 101 is between 1.5 [GHz] and 2.1 [GHz]. Here, the output frequency of when PLL is stable is 80 [MHz] (=1.99 [GHz]−1.91 [GHz]). By contrast with this, when the frequency band of VCO 101 is selected, the output of mixer 111 changes in a wide range between −110 [MHz] and 490 [MHz]. Therefore, the maximum operation frequency of phase comparator 102 that receives this output signal rises to 490 [MHz], resulting in the increase in power consumption.

By contrast with this, even under the same condition as in FIG. 7 where the division ratio of frequency divider 112 is 16, the target frequency is 1.91 [GHz], the local frequency is 1.99 [GHz] and the range of the oscillation frequency of VCO 101 is between 1.5 [GHz] and 2.1 [GHz] as shown in FIG. 6, frequency synthesizer 100 according to the present embodiment suppresses the input frequency in phase comparator 102 up to about 130 [MHz] at maximum by using frequency divider 112 (where the division ratio is 16 with the example in FIG. 6) instead of mixer 111 upon frequency band selection. In this way, it is possible to reduce the maximum operation frequency of phase comparator 102 and, consequently, reduce power consumption.

Further, although a case has been explained with FIG. 7 as an example where the division ratio P is 16, the division ratio P is not limited to 16.

As described above, according to the present embodiment, mixer 111 and frequency divider 112 connected with each other in parallel are provided in frequency converting circuit 110 and frequency divider 112 is used upon frequency band selection in VCO 101, so that it is possible to reduce the maximum operation frequency of phase comparator 102 upon frequency band selection in VCO 101, and, consequently, reduce power consumption.

Embodiment 2

Figure 8:
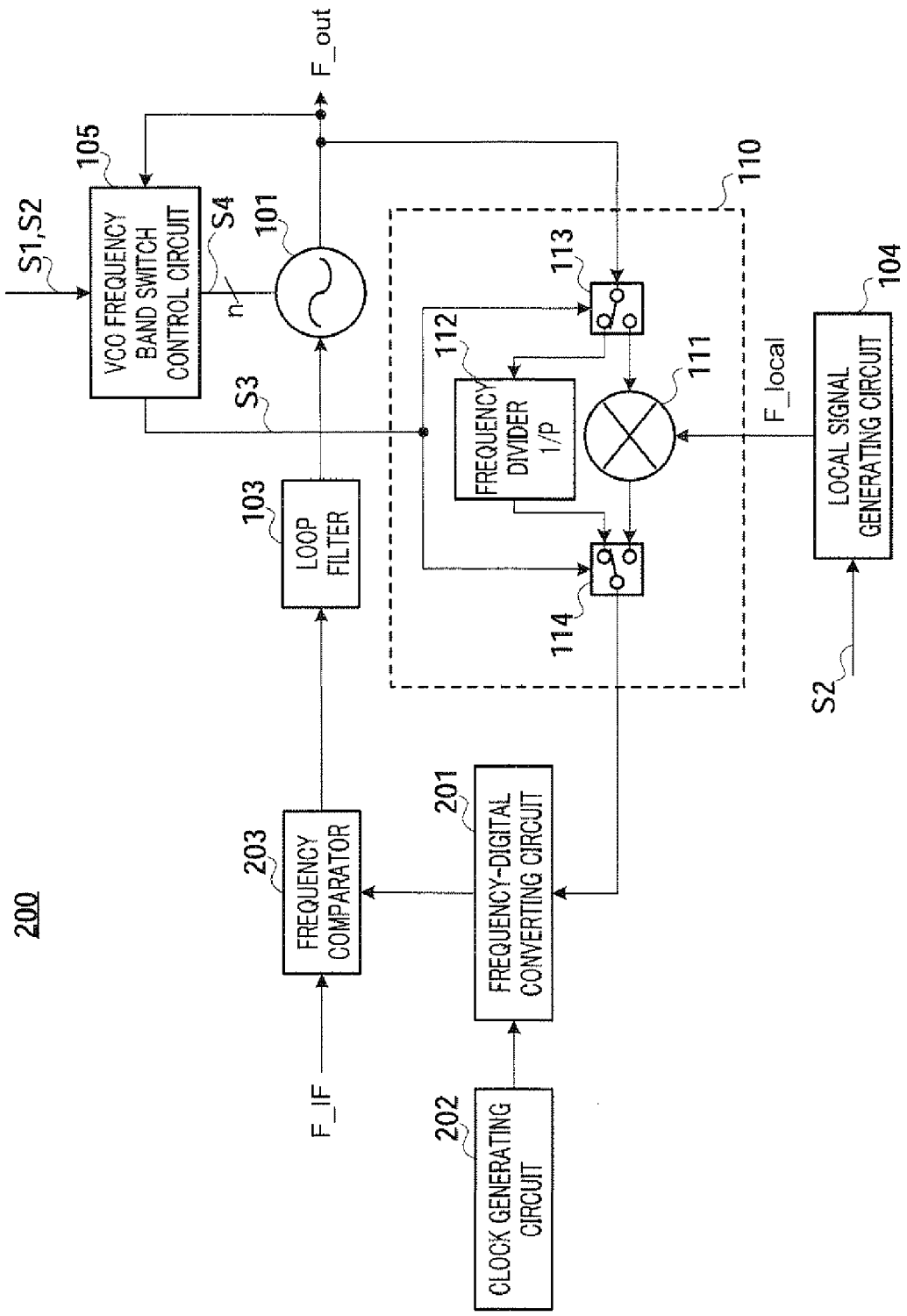
FIG. 8 is a block diagram showing the configuration of the frequency synthesizer according to Embodiment 2.

FIG. 8, assigning the same reference numerals to the same components as in FIG. 4, shows the configuration of the frequency synthesizer according to the present embodiment. Frequency synthesizer 200 differs from synthesizer 100 in FIG. 4 in having: frequency-digital converting circuit 201 that performs digital conversion of the output frequency from frequency converting circuit 110; and clock generating circuit 202 that generates an operation clock of frequency-digital converting circuit 201, and in having frequency comparator 203 instead of phase comparator 102.

Information about the frequency of a signal outputted from frequency converting circuit 110 is digitized by frequency-digital converting circuit 201, and is received as input in frequency comparator 203. Frequency comparator 203 compares information about the frequency of the signal outputted from frequency-digital converting circuit 201 with the frequency of the reference signal F_IF, and outputs a comparison result signal showing the frequency difference (also referred to as "frequency error"), to loop filter 103. Here, in frequency synthesizer 200 according to the present embodiment, frequency-digital converting circuit 201, frequency comparator 203 and loop filter 103 are configured by digital circuits, and are made a digital frequency-locked-loop configuration as a whole.

Figure 9:
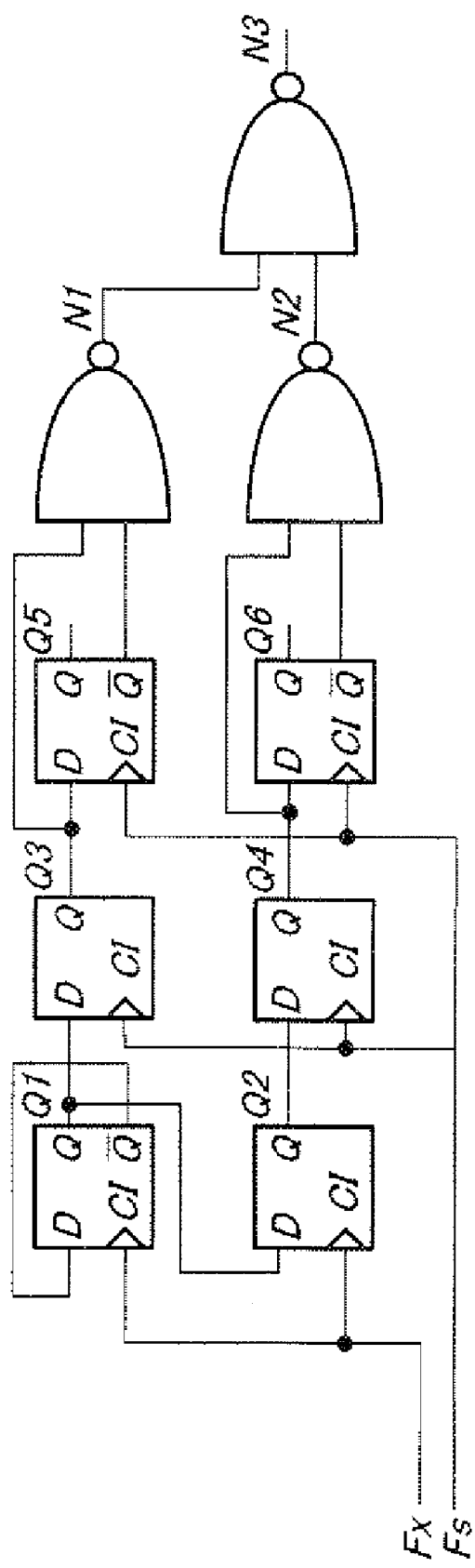
FIG. 9 is a connection diagram showing a configuration example of a frequency-digital converting circuit.

The essential requirement is that frequency-digital converting circuit 201 is configured as disclosed in, for example, Patent Literature 3. FIG. 9 shows the configuration of the frequency-digital converting circuit disclosed in Patent Literature 3. The frequency-digital converting circuit in FIG. 9 has a plurality of flip flops Q1 to Q6 connected in cascade, and NAND gates N1 to N3. By inputting the output signal of frequency converting circuit 110 as a clock signal Fx and inputting a clock signal from clock generating circuit 202 as a clock signal Fs in the configuration in FIG. 9, NAND gate N3 can output digitized frequency information.

Figure 10:
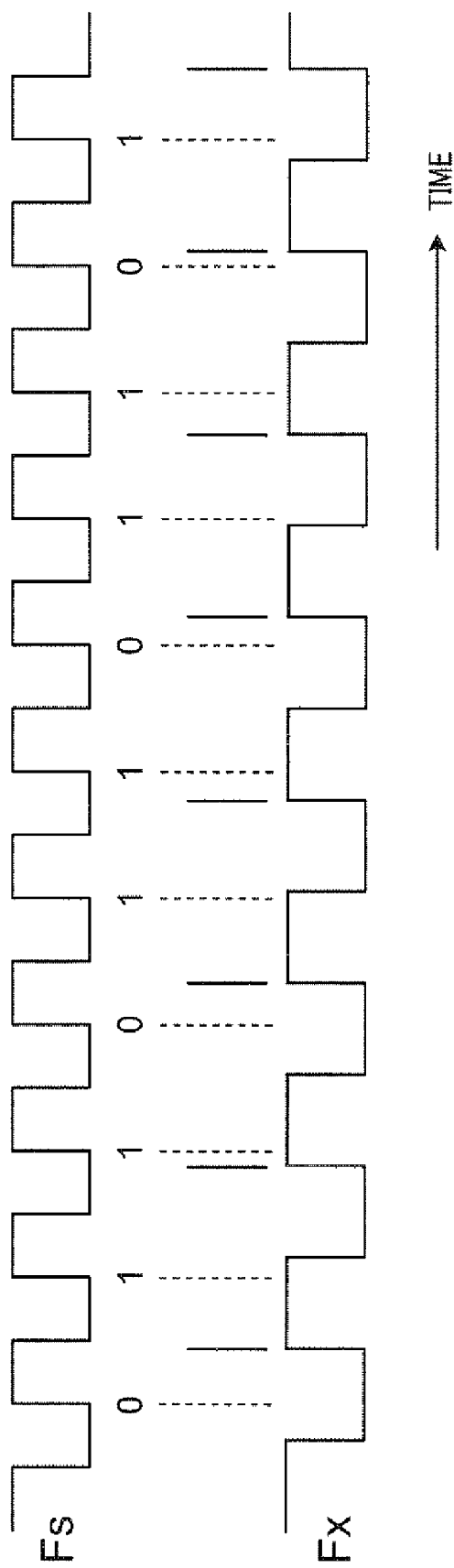
FIG. 10 illustrates the operation of the frequency-digital converting circuit.

FIG. 10 shows the operation of the frequency-digital converting circuit in FIG. 9. If there is a rising edge of the clock signal Fx in one cycle of the clock signal Fs, 1 is outputted from NAND gate N3, and, if there is not a rising edge of the clock signal Fx in one cycle of the clock signal Fs, 0 is outputted from NAND gate N3. That is, if the frequencies of the clock signal Fs and clock signal Fx are the same, 1 is outputted from NAND gate N3 at all times and, if the frequency of the clock signal Fx is zero, 0 is outputted from NAND gate N3 at all times. Accordingly, when the number of 1's is greater, the digital value outputted from NAND gate N3 means that the clock signal Fx (i.e. output signal of frequency converting circuit 110) is closer to the frequency of the clock signal Fs. As described above, frequency-digital converting circuit 201 can output digital values that represent frequencies by values from 0 to Fs. Practically speaking, frequency-digital converting circuit 201 outputs digitized frequency information to frequency comparator 203 through a digital filter for reducing conversion errors.

According to frequency synthesizer 200 of the present embodiment, even in the digital frequency-locked-loop configuration having frequency-digital converting circuit 201 and frequency comparator 203, mixer 111 and frequency divider 112 connected with each other in parallel are provided in frequency converting circuit 110 and frequency divider 112 is used upon frequency band selection in VCO 101 similar to Embodiment 1, so that it is possible to reduce the input frequency from frequency converting circuit 110 to frequency-digital converting circuit 201 and the output frequency from clock generating circuit 202 upon frequency band selection in VCO 101 and, consequently, reduce power consumption.

Embodiment 3

Figure 11:
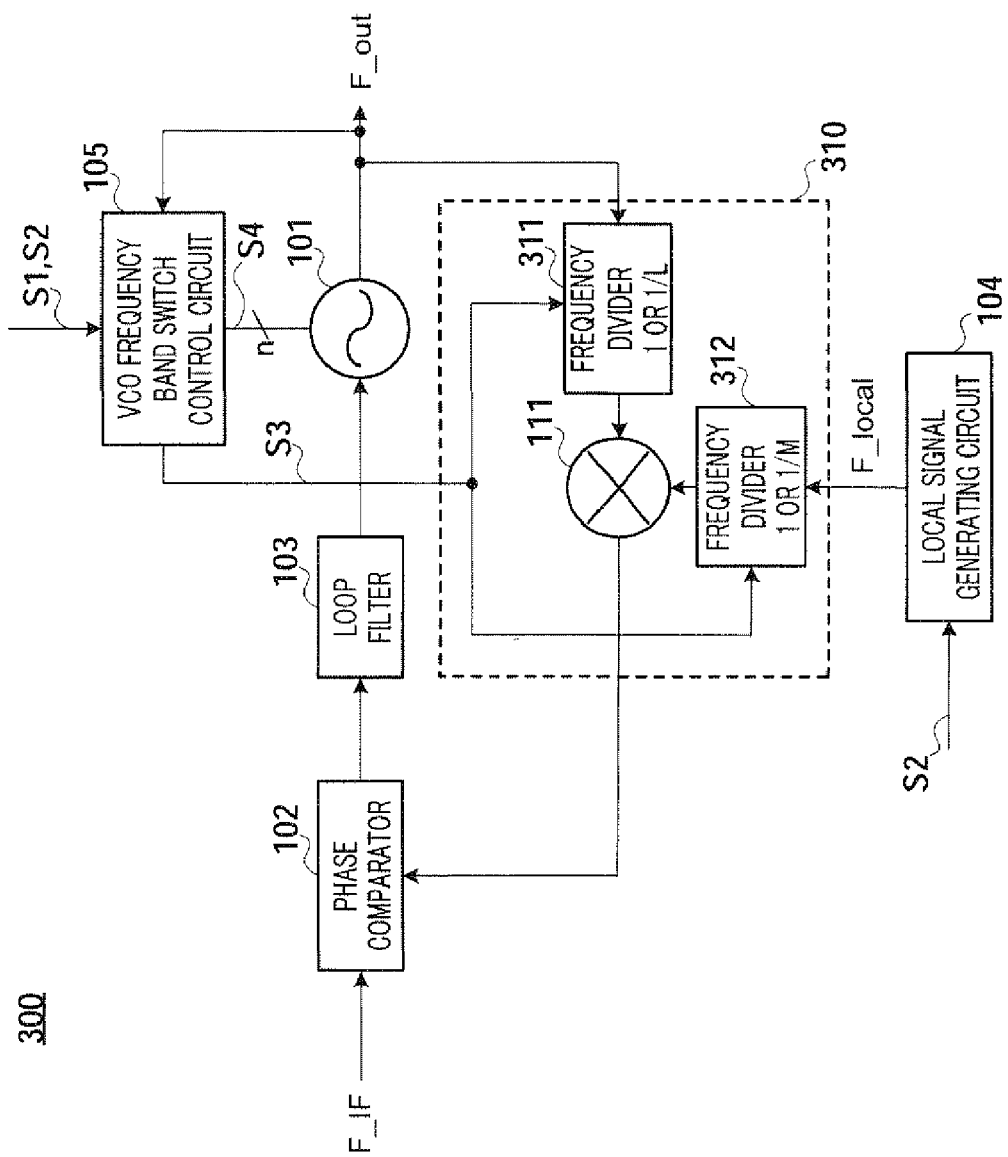
FIG. 11 is a block diagram showing the configuration of the frequency synthesizer according to Embodiment 3.

FIG. 11, assigning the same reference numerals to the same components as in FIG. 4, shows the configuration of the frequency synthesizer according to the present embodiment. Frequency synthesizer 300 differs from frequency synthesizer 100 in FIG. 4 in the configuration of frequency converting circuit 310.

Frequency converting circuit 310 according to the present embodiment provides frequency divider 311 that can switch the division ratio between 1 and L (where L is an integer equal to or greater than 2), between VCO 101 and mixer 111. Further, frequency converting circuit 310 provides frequency divider 312 that can switch the division ratio between 1 and M (where M is an integer equal to or greater than 2), between mixer 111 and local signal generating circuit 104.

In frequency dividers 311 and 312, the division ratios are controlled to 1 upon frequency band selection in VCO 101 according to the switching control signal S3 from VCO frequency band switch control circuit 105, and are controlled to L and M in cases other than frequency band selection in VCO 101 (that upon transmission). Further, the operation timings are the same as in FIG. 5.

Figure 12:
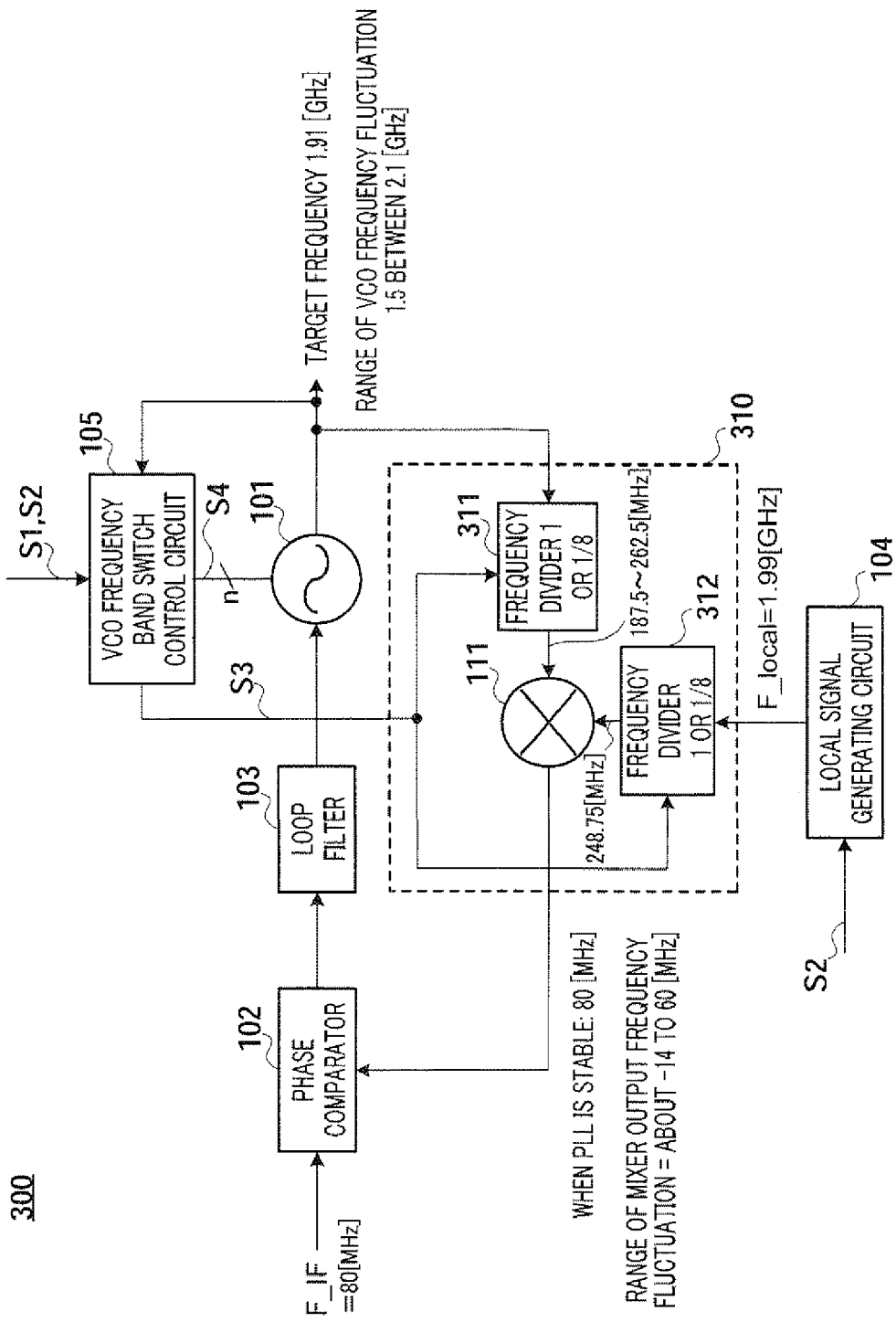
FIG. 12 shows an example of frequency characteristics in the frequency synthesizer according to Embodiment 3.

FIG. 12 shows an example of the frequency in frequency synthesizer 300 according to the present embodiment. FIG. 12 shows a case as an example where the target frequency 1.91 [GHz], the local frequency is 1.99 [GHz] and the range of the oscillation frequency of VCO 101 is between 1.5 [GHz] and 2.1 [GHz]. By controlling the division ratios in frequency dividers 311 and 312 to 8 upon frequency band selection, it is possible to suppress the input frequency of phase comparator 102 up to about 60 [MHz] at maximum, and, consequently, reduce power consumption.

According to the present embodiment, frequency divider 311 that can switch the division ratio between 1 and L (where L is an integer equal to or greater than 2) is provided between VCO 101 and mixer 111 and frequency divider 312 that can switch the division ratio between 1 and M (where M is an integer equal to or greater than 2) is provided between mixer 111 and local signal generating circuit 104, and the division ratios in frequency dividers 311 and 312 are switched to integers equal to or greater than 2 upon frequency band selection in VCO 101, so that it is possible to reduce power consumption.

Embodiment 4

Figure 13:
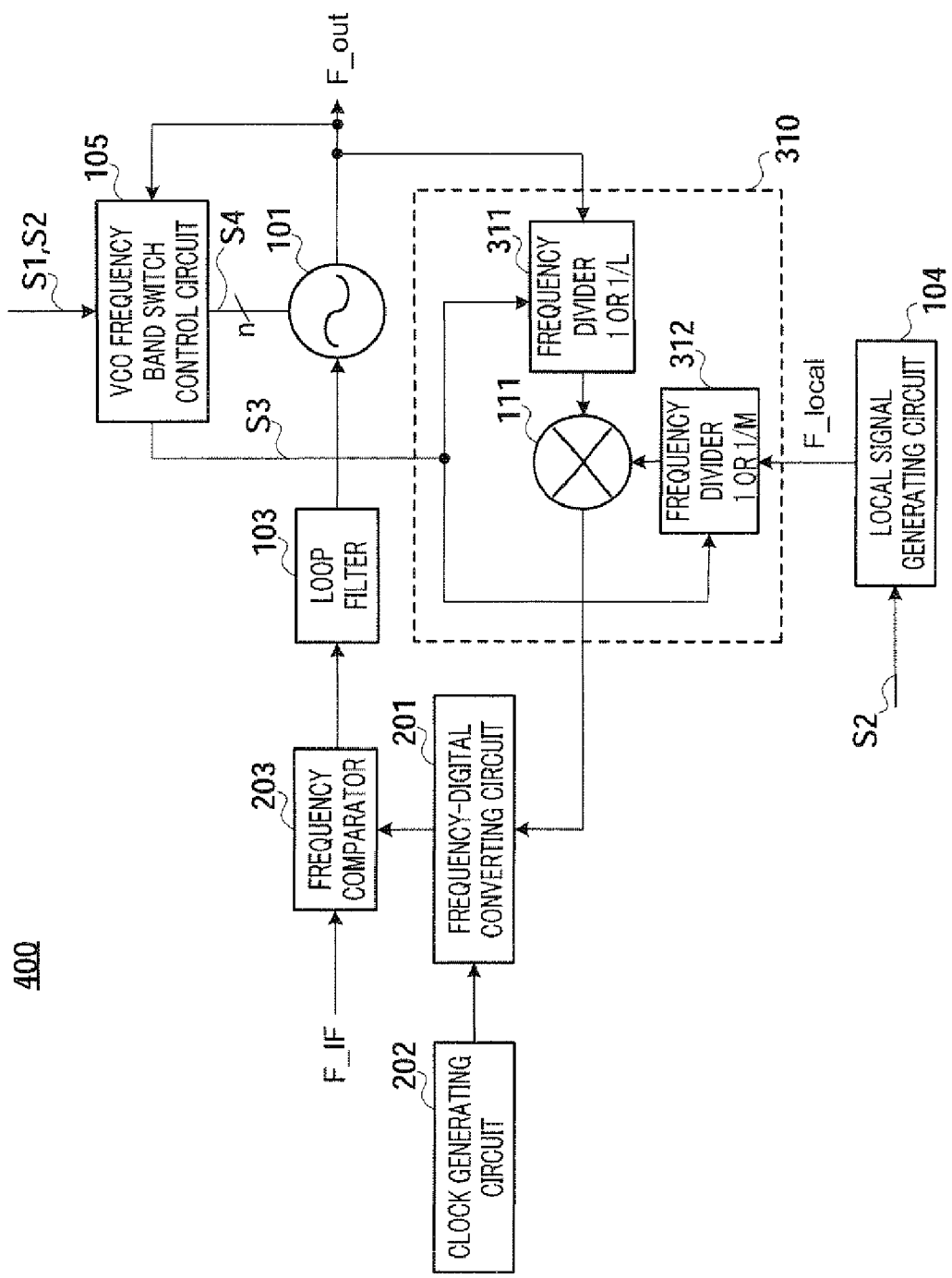
FIG. 13 is a block diagram showing the configuration of the frequency synthesizer according to Embodiment 4.

FIG. 13, assigning the same reference numerals to the same components as in FIG. 11 and FIG. 8, shows the configuration of the frequency synthesizer according to the present embodiment. Frequency synthesizer 400 differs from frequency synthesizer 300 in FIG. 11 in having: frequency-digital converting circuit 201 that performs digital conversion of the output frequency from frequency converting circuit 310; and clock generating circuit 202 that generates the operation clock of frequency-digital converting circuit 201, and in having frequency comparator 203 instead of phase comparator 102.

The configurations of frequency-digital converting circuit 201 and frequency comparator 203 have already been explained with Embodiment 2, and therefore explanation thereof will be omitted.

According to frequency synthesizer 400 of the present embodiment, even in the digital frequency-locked-loop configuration having frequency-digital converting circuit 201 and frequency comparator 203, frequency divider 311 that can switch the division ratio between 1 and L (where L is an integer equal to or greater than 2) is provided between VCO 101 and mixer 111 and frequency divider 312 that can switch the division ratio between 1 and M (where M is an integer equal to or greater than 2) is provided between mixer 111 and local signal generating circuit 104, and the division ratios in frequency dividers 311 and 312 are switched to integers equal to or greater than 2 upon frequency band selection in VCO 101 similar to Embodiment 3, so that it is possible to reduce the input frequency from frequency converting circuit 310 to frequency-digital converting circuit 201 and the output frequency from clock generating circuit 202 upon frequency band selection in VCO 101, and, consequently, reduce power consumption.

Embodiment 5

Figure 14:
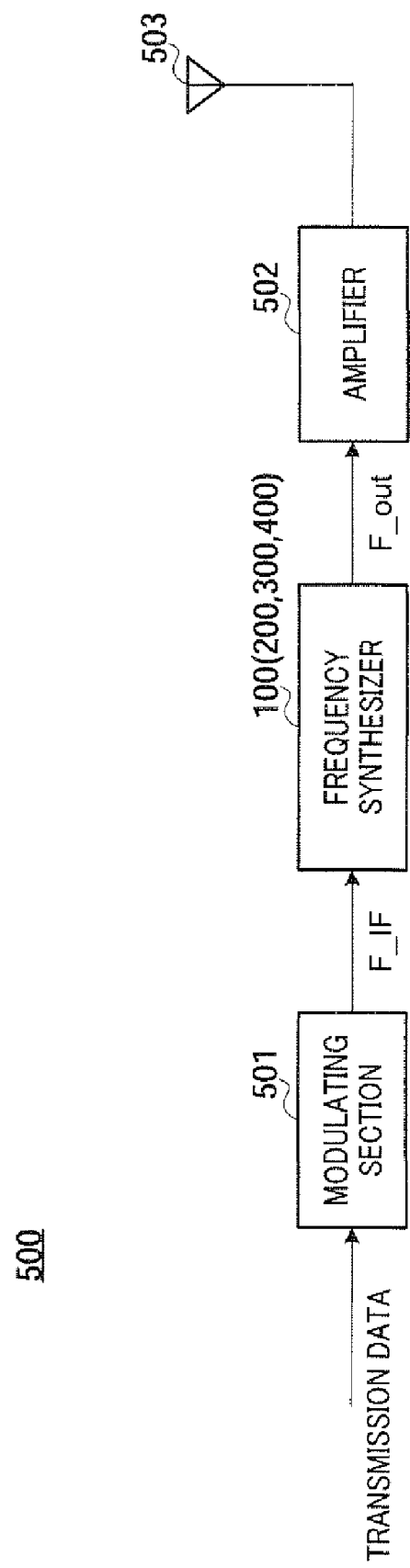
FIG. 14 is a block diagram showing a configuration of a radio transmitting apparatus according to Embodiment 5.

FIG. 14 shows the configuration of a radio transmitting apparatus mounting the frequency synthesizer according to one of Embodiments 1 to 4. Radio transmitting apparatus 500 has: frequency synthesizer 100 (200, 300, 400) according to one of Embodiments 1 to 4; modulating section 501 that forms modulated signals from transmission data; amplifier 502 that amplifies the transmission signals F_out of the RF band acquired in frequency synthesizer 100 (200, 300, 400); and antenna 503 that transmits the amplified signals.

As described above, radio transmitting apparatus 500 is configured by mounting the frequency synthesizer according to the present invention, so that it is possible to reduce power consumption. As a result, when radio transmitting apparatus 500 is mounted in, for example, a mobile terminal, it is possible to realize a small mobile terminal that can be used for a long time.

The invention claimed is:

1. A frequency synthesizer comprising:
a voltage control oscillator that covers a plurality of selectable oscillation frequency bands and that oscillates a signal of a frequency matching a voltage applied to a control voltage terminal;
a frequency converting circuit that comprises a mixer and a frequency divider connected with each other in parallel and that down-converts a frequency of an output signal of the voltage control oscillator using selectively one of the mixer and the frequency divider;
a comparator that compares a signal outputted from the frequency converting circuit, with a reference signal, and outputs a comparison result signal; and
a loop filter that smoothes the comparison result signal and outputs the smoothed signal to the control voltage terminal of the voltage control oscillator, wherein:
the frequency converting circuit uses the frequency divider while an oscillation frequency band selection operation of the voltage control oscillator is executed, and uses the mixer when an oscillation frequency band of the voltage control oscillator covers a target frequency.

2. The frequency synthesizer according to claim 1, wherein the frequency converting circuit uses the frequency divider when the oscillation frequency band of the voltage control oscillator is selected.

3. The frequency synthesizer according to claim I, wherein the comparator comprises a phase comparator, and compares a phase of the signal outputted from the frequency converting circuit, with a phase of the reference signal, and outputs the comparison result signal showing a phase difference.

4. The frequency synthesizer according to claim 1, further comprising a frequency-digital converting circuit that performs digital conversion of a frequency of the signal outputted from the frequency converting circuit, wherein
the comparator comprises a frequency comparator, and compares information about a frequency of the signal outputted from the frequency-digital converting circuit, with a frequency of the reference signal, and outputs the comparison result signal showing a frequency difference.

5. A radio transmitting apparatus comprising the frequency synthesizer according to claim 1.

* * * * *